(12) United States Patent
Youn et al.

(10) Patent No.: US 7,004,108 B2
(45) Date of Patent: Feb. 28, 2006

(54) APPARATUS FOR FIXING AN ELECTRODE IN PLASMA POLYMERIZING APPARATUS

(75) Inventors: Dong-Sik Youn, Changwon (KR); Sam Chul Ha, Changwon (KR)

(73) Assignee: LG Electronics Inc., Seoul (KR)

( * ) Notice: Subject to any disclaimer, the term of this patent is extended or adjusted under 35 U.S.C. 154(b) by 246 days.

(21) Appl. No.: 10/181,228

(22) PCT Filed: Nov. 16, 2001

(86) PCT No.: PCT/KR01/01964

§ 371 (c)(1),
(2), (4) Date: Nov. 13, 2002

(87) PCT Pub. No.: WO02/41672

PCT Pub. Date: May 23, 2002

(65) Prior Publication Data

US 2003/0121474 A1    Jul. 3, 2003

(30) Foreign Application Priority Data

Nov. 16, 2000 (KR) .............................. 2000-68026

(51) Int. Cl.
*C23C 16/00* (2006.01)
(52) U.S. Cl. ................................................. 118/723 E
(58) Field of Classification Search ............ 118/723 E, 118/723 R, 728, 729, 718, 715, 725, 719; 156/345.43, 345.51, 345.54, 345.2, 345.46, 156/345.44, 345.47, 345.45; 216/69.11; 204/298.41
See application file for complete search history.

(56) References Cited

U.S. PATENT DOCUMENTS

| | | | | |
|---|---|---|---|---|
| 4,289,598 A | * | 9/1981 | Engle | ................... 204/192.32 |
| 4,371,412 A | * | 2/1983 | Nishizawa | ............. 156/345.45 |
| 5,269,881 A | * | 12/1993 | Sekiya et al. | ............... 134/1.1 |
| 5,843,536 A | | 12/1998 | Scharfenberger et al. | |
| 6,192,828 B1 | * | 2/2001 | Takahashi et al. | ....... 118/723 E |

FOREIGN PATENT DOCUMENTS

| | | |
|---|---|---|
| JP | 60-151295 U | 10/1985 |
| JP | 63157877 A * | 6/1988 |
| JP | 02-226700 A | 9/1990 |
| JP | 5-101898 A | 4/1993 |
| JP | 06-243994 A | 9/1994 |
| JP | 09-035894 A | 2/1997 |
| JP | 09-320799 A | 12/1997 |
| JP | 12-286095 A | 10/2000 |
| KR | 2001/019020 A * | 3/2001 |

* cited by examiner

*Primary Examiner*—Parviz Hassanzadeh
*Assistant Examiner*—Michelle Crowell
(74) *Attorney, Agent, or Firm*—Birch, Stewart, Kolasch & Birch, LLP

(57) ABSTRACT

An apparatus for fixing an eletrode of an electrode of plama polymerization apparatus is provided, which comprises; a nonconductive holder for fixing an electrode by covering an end part of the electrode, a leadline connecting the electrode with a power supply, and a fixing part fixing the holder on a chamber wall.

10 Claims, 7 Drawing Sheets

APPARATUS FOR FIXING AN ELECTRODE IN PLASMA POLYMERIZING APPARATUS

This application is the national phase under 35 U.S.C. §371 of PCT International Application No. PCT/KR01/01964 which has an International filing date of Nov. 16, 2001, which designated the United States of America.

TECHNICAL FIELD

The present invention relates to an electrode in a plasma polymerizing apparatus and particularly, to an apparatus for fixing electrode in a plasma polymerizing apparatus, capable of insulating an electrode, preventing transformation of the electrode by fixing the electrode on a wall of a chamber and easing installing and removing of the electrode.

BACKGROUND ART

If a surface of a substrate such as a steel plate is coated with a thin film using plasma, a stratum tectorium having good consistency and abrasion resistance is formed. Products having the stratum tectorium are used as a magnetic disk, optical disk, carbide tool and the like. Also, if the paint-coated film generated on the surface of a steel plate is undergone plasma processing, an unplasticized paint which coated steel plate having good durability and corrosion resistance. Particularly, through the processing, quality of the surfaces can be improved increasing hydrophile and hydrophobe by polymer polymerizing the surface of the substrate, and the improved substances are widely in use.

As a typical example of the plasma polymerizing apparatus, an apparatus is disclosed in WO99/28530. In FIG. 1, the apparatus is composed of a vacuum chamber 1, and electrode 4 installed in the chamber vacuum pumps 5, 6 for controlling pressure in the vacuum chamber, gauges 7, 8 for measuring degree of vacuum, a power supply apparatus 3 for generating potential difference in an electrode, and reactive gas adjusting apparatuses 9, 10 for supplying unreactive gas such as reactive gas and nitrogen around the substrate.

An example of plasma polymerizing processing by the above apparatus will be described as follows. The substrate 2 is installed in the chamber 1 and whether the pressure in the chamber is maintained to be vacuous about $10^{-6}$ Torr is checked with the ion gauge 8 by starting the diffusion pump 6 after checking whether the pressure in the chamber is maintained to be vacuous about $10^{-3}$ Torr with the thermocouple gauge 7 by starting the rotary pump 5. The substrate is biased-positioned as an anode (or an active electrode) by the power supply 3 and the electrode 4 on the other side is grounded. If the pressure of the chamber is maintained as regular vacuum, reactive gas and unreactive gas are supplied around favorable places in order. The mixture ratio is controlled by the pressure of the thermocouple measurer. In case the pressure in the vacuum chamber become a certain vacuum, the vacuum chamber is discharged with direct current or high-frequency wave. Then, in the plasma generated by the direct current or high-frequency wave, the molecular binding is broken and the broken chains and activated cation and anion combine, thus to form a polymerized material on the surface of the substrate which is positioned between the electrodes.

In the above apparatus, a power is not supplied to the electrode 4 and is grounded. In case a power is supplied to the electrode, the electrode is needed to be insulated with the chamber and a means for fixing the electrode is needed to position the substrate to have a predetermined interval from the processed substrate. Particularly, in case of an apparatus capable of continuously performing plasma polymerizing processing as well as the above discontinuous apparatus, when the apparatus is operated for a long time, the electrode can be slack down or the interval between the electrode and the substrate can be changed.

TECHNICAL GIST OF THE PESENT INVENTION

Therefore, an object of the present invention is to provide an electrode structure, capable of insulating an electrode and chamber in case a power is supplied to the electrode in a plasma polymerizing apparatus.

Also, another object of the present invention is to provide a tensile force adjusting means for efficiently fixing the electrode for a long time and preventing deformation of the electrode.

Also, still another object of the present invention is to provide an apparatus for fixing electrode in a plasma polymerizing apparatus which is appropriate for easing installing and removing of the electrode in the chamber to be simply completed in a short time.

DETAILED DESCRIPTION OF THE INVENTION

In order to achieve the above objects, there is provided an apparatus for fixing electrode in a plasma polymerizing apparatus, including a processing chamber, a vacuum pump for maintaining vacuum condition in the chamber, at least one electrode positioned in the chamber, for discharging high voltage, an apparatus for fixing the electrode which fixes the electrode and a power supply for applying electric power to the electrode and the apparatus for fixing the electrode includes an electrode holder part made of insulating material, for covering and fixing the end of the electrode, a lead line part passing through the electrode holder part for electrically connecting the electrode and the power supply and a fixing part for fixing the electrode holder part in a proper position in the chamber.

Also, in order to achieve the above objects, there is provided an apparatus for fixing electrode in a plasma polymerizing apparatus, including a processing chamber, a vacuum pump for maintaining vacuum condition in the chamber, at least one sheet-shaped electrode positioned in the chamber, for discharging high voltage, a power supply for applying electric power to the electrode, an electrode holder part made of insulating material, for covering and fixing the end of the electrode, a lead line part passing the electrode holder part for electrically connecting the electrode and the power supply apparatus, a fixing part for fixing the electrode holder part in a proper position in the chamber and an elastic part for providing an elastic force in the longitudinal direction of the electrode.

Also, in order to achieve the above objects, there is provided an apparatus for fixing electrode in a plasma polymerizing apparatus, including a processing chamber, a vacuum pump for maintaining vacuum condition in the chamber, at least one sheet-shaped electrode positioned in the chamber, for discharging high voltage, a power supply for applying electric power to the electrode, an electrode holder part made of insulating material, for covering and fixing the end of the electrode, a lead line part passing the electrode holder part for electrically connecting the electrode and the power supply apparatus and an internal holder made of cylindrical conductive substance, which is fixed covered by the electrode holder part and to which an end of the electrode is wound.

BRIEF DESCRIPTION OF THE DRAWINGS

FIG. 6b is a cross-sectional view taken along section line A—A of FIG. 6a.

MODE FOR CARRYING OUT THE PREFERRED EMBODIMENTS

Figure 1:
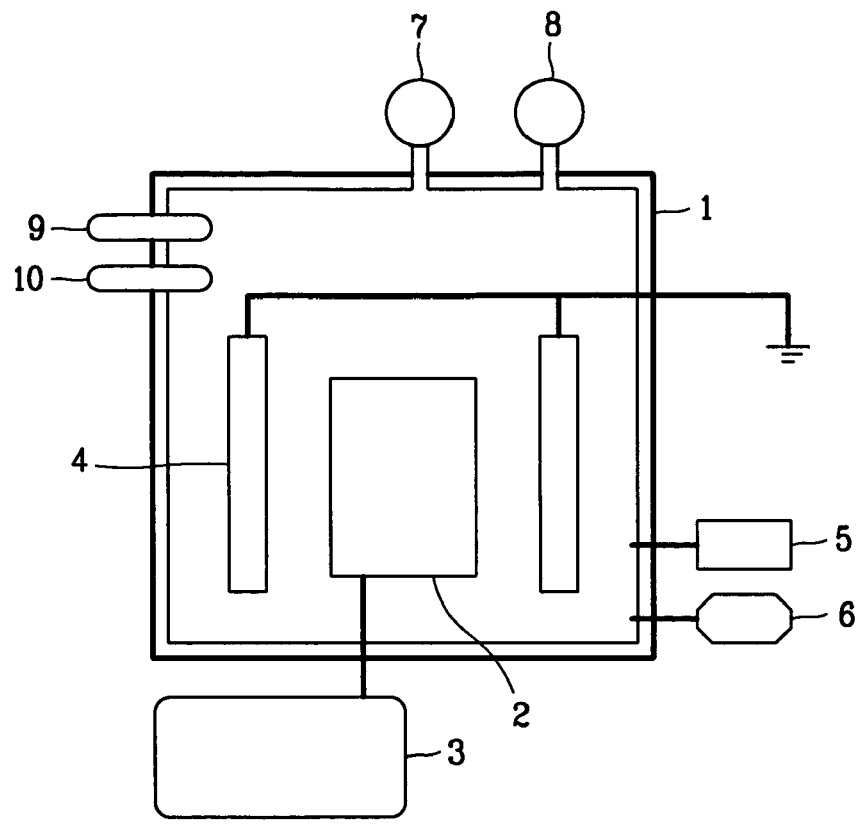
FIG. 1 is a schematic view showing a conventional plasma polymerizing apparatus.

The present invention will now be described with reference to accompanying drawings. An electrode installed in the processing chamber in a plasma polymerizing apparatus can be formed variously but generally, it is formed in a sheet-shaped form. The sheet-shaped electrode is installed maintaining a predetermined interval from the upper or lower or both portions of a substrate. When a power is supplied, discharge is occurred among electrodes and by the discharge, the condition of reactive gas supplied into the chamber becomes plasma condition.

The gas under the plasma condition modifies the surface of the substrate positioned in the chamber or forms a new surface layer. Maintaining a predetermined interval between the electrode and the substrate to be surface-processed is very important to uniformly surface-processing the substrate by plasma polymerizing.

To maintain the predetermined interval between the electrode and the substrate to be polymerized, a means for fixing the electrode is necessary. The means for fixing electrode prevents the electrode from being slack by fixing both edges of the electrode and adding a predetermined tensile force.

On the other hand, if a power is supplied to the electrode, insulating between the means for fixing the electrode and the chamber is needed since the means for fixing electrode is fixed on the wall of the chamber and abutted to the chamber.

The apparatus for fixing the electrode includes a sheet-shaped electrode, an electrode holder fixed on the inner wall of the chamber, which is made of insulating substance completely covering the end of the electrode, a lead line part for connecting the electrode with the proper position on the inner wall of the chamber.

Also, the apparatus can include an inner holder made of conductive substance abutted to the end of the electrode and the electrode holder part is fixed completely covering the inner holder.

The inner holder can be made of cylindrical conductive substance to which an end of the electrode is wound in accordance with an embodiment and the holder can be composed of two plates abutted on an upper and lower surfaces of end of the electrode in accordance with another embodiment.

In any case, it is desirable that the inner holder is made of conductive substance.

It is desirable that the electrode holder includes the inner holder and covers the electrode. Also, it is desirable that the electrode holder is composed of an upper holder and lower holder, thus to ease installation and removing of the electrode.

To the electrode, the power must be supplied in any ways and electricity can flow to the electrode by directly connecting the power supply apparatus and the electrode or connecting the inner holder and the lead line.

On the other hand, the electrode can be sheet-shaped mesh type metal. The mesh type electrode can prevent concentration of electric fields at the edges of the electrode and also ease fixing of the end of the electrode to the inner holder.

The electrode structure in accordance with the present invention is devised to be installed in the chamber in the plasma polymerizing apparatus but the present invention can be applied to every apparatus similar to it. Particularly, the present invention is useful for a continuous processing apparatus capable of continuously surface-processing for a long time.

Figure 2:
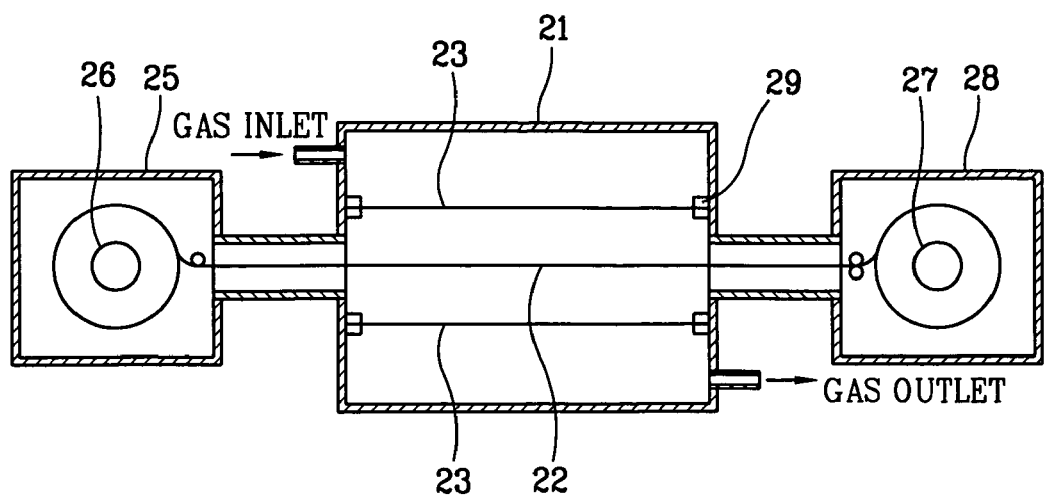
FIG. 2 is cross-sectional view showing a plasma polymerizing continuous processing system.

An example of the continuous plasma polymerizing apparatus is shown in FIG. 2. As shown in the drawing, an electrode 23 is fixed to the upper and lower sides having a predetermined interval so that the substrate 22 can pass the channel in the processing chamber 21 and an unwinder 26 on which the substrate is wound is installed in an unwinder chamber 25 installed at the front of the processing chamber 11. At the rear of the processing chamber 11, a winder 27 for winding the substrate, having a deposited polymerizing film, is installed in a winder chamber 28. The both ends of the electrode is fixed on the inner wall of the chamber by the electrode holder 29.

On the drawing, the electrode is installed in the chamber in parallel with the direction of the flowing of the substrate to be surface-processed, but in case the electrode is installed in the vertical direction, namely, in case the electrode is installed in the vertical direction on the same plane same as the direction of the flow of the substrate, the apparatus for fixing the electrode in accordance with the present invention can also be applied. Also, the apparatus for fixing the electrode in accordance with the present invention can be used also in case many electrodes are installed opposed to each other on a surface or upper and lower surfaces of the substrate as well as in case an electrode is installed on a surface.

Figure 3:
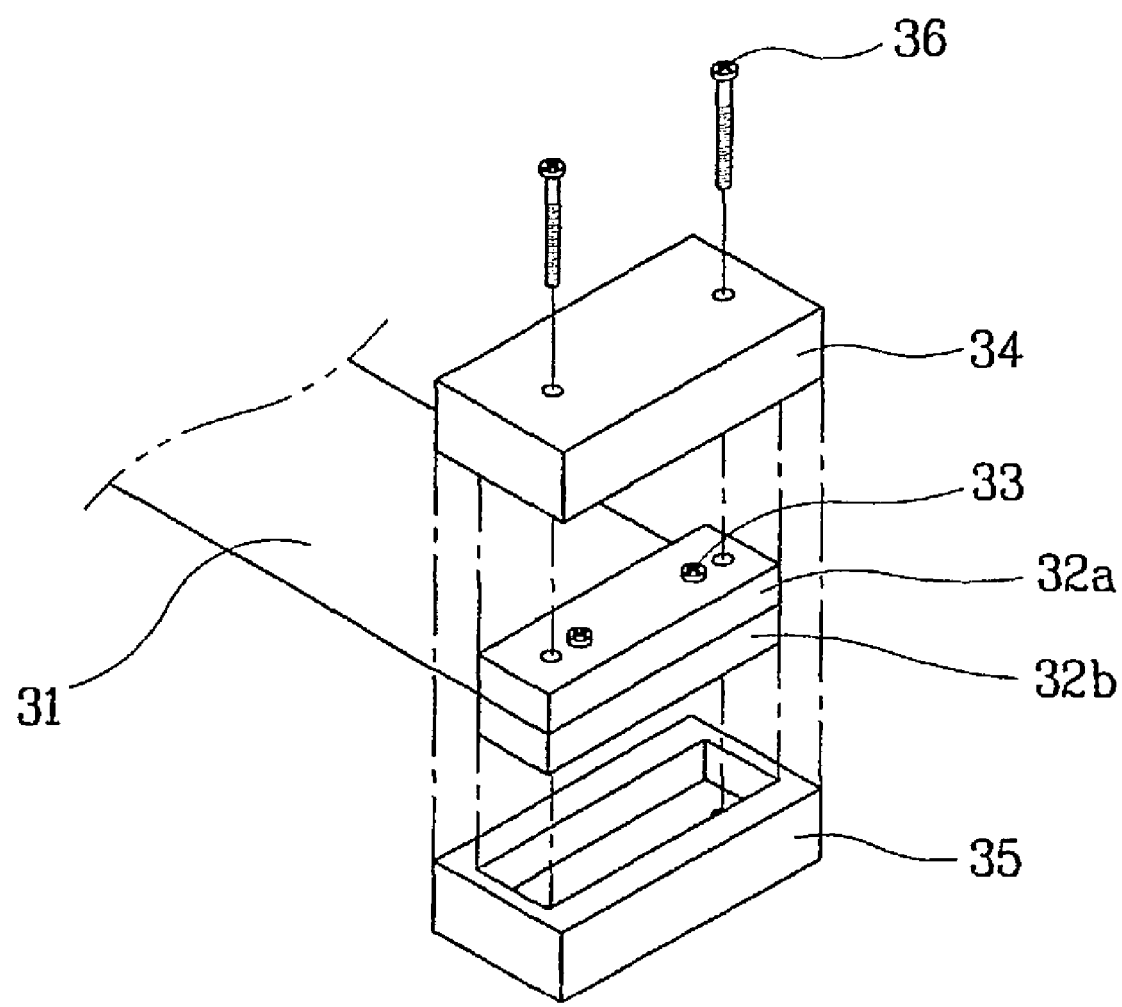
FIG. 3 is a perspective view showing an embodiment of the present invention.

An embodiment of the present invention is shown in FIG. 3. As shown in the drawing, the ends of the electrode 31 are inner holders on the upper and lower surfaces and are fixed to the combining means 33 under the condition that the upper plate 32a and lower plate 32b are abutted to each other and each plate and electrode holder are fixed using a combining means 36 on the outer surface of each plate under the condition that the upper electrode holder 34 and lower electrode holder 35 are abutted to cover the whole plate. It is desirable that the electrode holder has a groove so that a plate can be inserted in the inner surface. It is desirable that the combining means are a screw or rivet which are conventionally used, but any devices with the same function can be used. The other end of the electrode not shown on the drawing is fixed by the inner holder and electrode holder same as the opposite one.

To have the upper and lower plates for fixing the electrode transmit the supplied power source to the electrode, the material of the plates must be made of conductive body and on the other hand, the upper and lower electrode holders must maintain insulating performance so that the supplied power source is transmitted only to the electrode and not to be transmitted to the outside. To achieve this, the electrode holder is fabricated with insulating substance having a relatively good heat resistance and completely covers the end of the electrode and plate to intercept the electrode from transmitting electricity to the circumference such as the chamber wall.

The upper and lower plate is adhered to the electrode itself so that the electrode combines with the electrode holder. A surface of the plate is abutted to the electrode holder, thus to maintain a predetermined frictional force with the electrode and electrode holder. Consequently, the electrode and electrode holder maintains a solid combination through the medium of the upper plate and lower plate.

In case the electrode is replaced, it is desirable that the electrode is replaced being attached with the plate without separating the electrode from the plate.

The method for supplying a power source to the electrode can have many examples and hereinafter, the case that the power supply means is included in the apparatus of fixing the electrode in accordance with the present invention will be described.

Figure 4A:
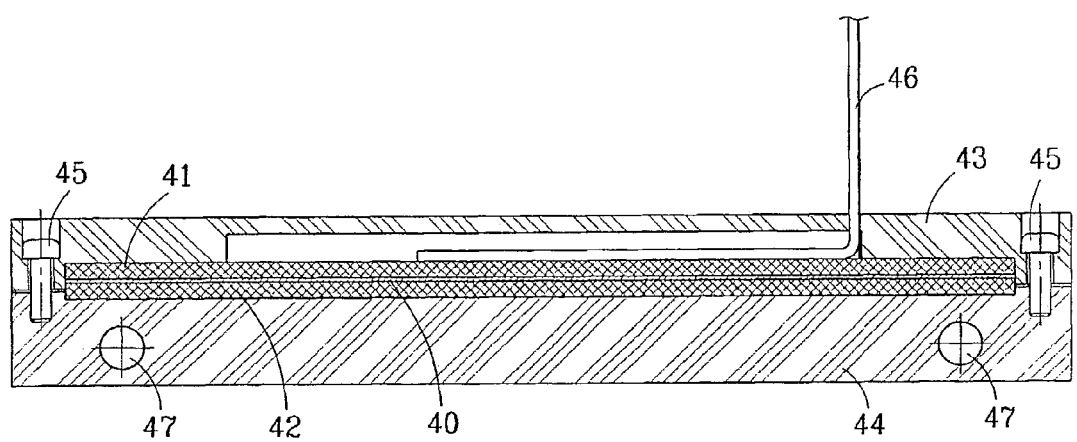
FIG. 4a is a longitudinal sectional view showing another embodiment of the present invention.
Figure 4B:
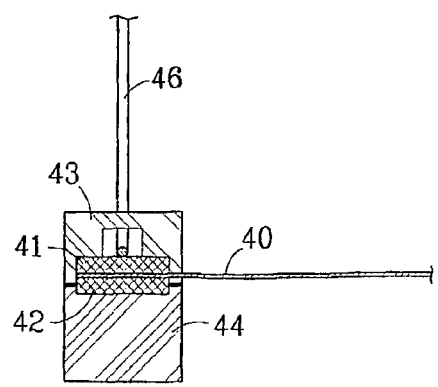
FIG. 4b is the other longitudinal sectional view showing another embodiment of the present invention.

FIGS. 4a and 4b are another embodiments of the present invention and longitudinal section and transverse section are respectively shown. The both ends of the electrode 40 are fixed-abutted by the upper plate 41 and lower plate 42 at the upper and lower portions. The plates are respectively fixed-abutted by the upper holder 43 and the lower holder 44.

A lead line 46 such as the electric wire is connected to the upper plate. In the embodiment in the drawing, the lead line is connected to the upper plate, but the lead line can be connected to the lower plate.

The upper holder 43 and lower holder 44 are strongly combined by the combining means 45 such as a screw and fix the electrode and plate. The electrode holder is fixed on the chamber wall by the fixing means again. Reference numeral 47 designates a combining portion for fixing the inner wall of the chamber (not shown) and the lower holder 44. The upper plate and lower plate are combined to each other by the combining means such as the screw centering the electrode.

In the above embodiment, the lead line is abutted to the upper plate which covers the electrode, through the through groove formed in the electrode holder and electricity flows through the electrode indirectly. On the other hand, an opening can be formed on a part of the surface of the plate and the electricity applying means can be directly abutted to the electrode. Also, electricity can flow by connecting the lead line to the combining part (for instance, the screw) between the upper and lower holders.

The other side of the lead line is connected to the power source supply apparatus outside the chamber and it is desirable that an insulating part is formed on the chamber wall to be insulated or insulating substance is coated on the lead line itself at the portion protruded by the lead line on the chamber wall.

Figure 5:
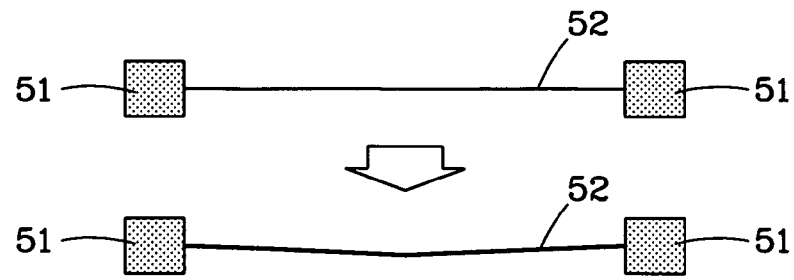
FIG. 5 is a schematic view showing thermal deformation of an electrode according to the polymerizing processing.

With the present invention, the electrode holder gives a tensile force so that the electrode is remained in a predetermined shape and particularly, it is important that it gives a tensile force from the both sides of the electrode so that a part of the electrode is not slack by the gravity while the polymerizing processing is performed. In case the polymerizing processing is performed for a long time, the temperature of the electrode rises and heat deformation is generated in the electrode as time passes. By the heat deformation of the electrode, the initial shape of the electrode becomes slack in the direction of the gravity and such phenomenon is shown in FIG. 5. In lower portion of FIG. 5, sagging of the electrode by the heat deformation can be shown.

Reference numeral 51 designates an electrode holder. When the electrode becomes slack, the distance between the substrate and electrode becomes different according to the part of the electrode. Accordingly, uniformity of the film which is polymerized on the surface of the substrate decreased and the polymer material formed on the surface of the substrate can not be abutted well, thus to decrease durability of the polymer film and deteriorate the quality of product.

The means for having the electrode holder continuously give the tensile force to the electrode will be described as follows.

Figure 6A:
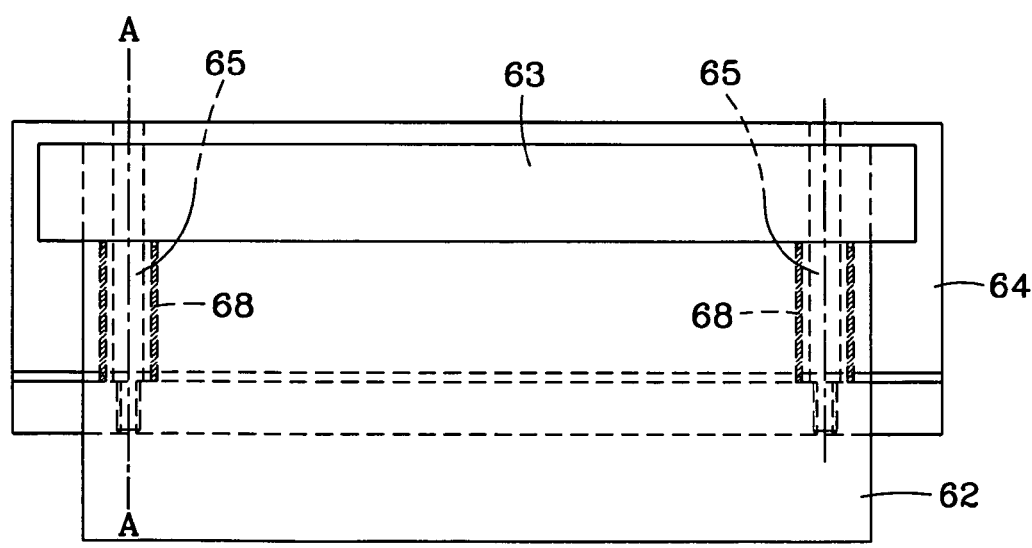
FIG. 6a is a plan view showing still another embodiment of the present invention.

FIG. 6a is a plan view showing and embodiment of a tensile force adjusting means in the apparatus of fixing the electrode in accordance with the present invention, having an elastic part for giving elastic force in the longitudinal direction of the electrode. The electrode 62 is fixed in gear with the holder 63 and the holder is positioned on the supporting part 64. The supporting part is fixed on the inner wall of the chamber and a sliding guide pin 65 is lengthened penetrating the holder on the supporting part. The holder can move in the longitudinal direction of the electrode by the sliding guide pin. A compressive spring 38 is inserted as an elastic body between an end of the supporting part and the holder.

Figure 6B:
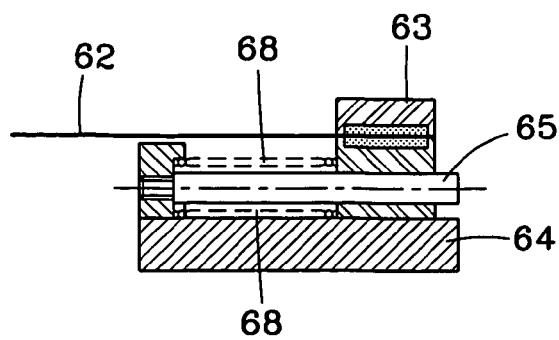

FIG. 6b is a cross-sectional view taken along section line A—A of FIG. 6a and shows respective components more precisely. Particularly, the position of the compressive spring 68 between the end of the supporting part 64 and the holder 63 is shown in detail.

Figure 7A:
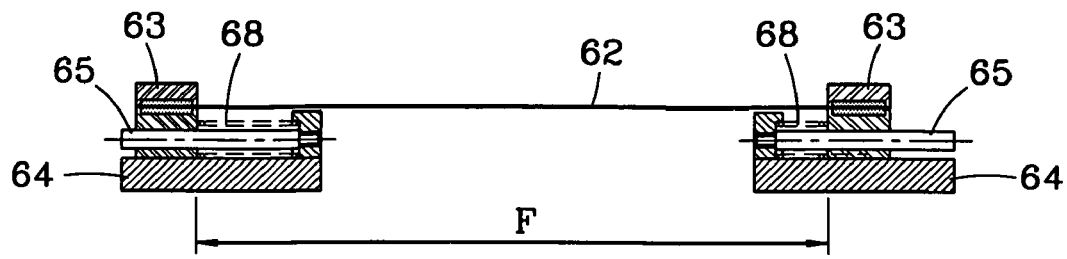
FIG. 7a is a cross-sectional view showing an electrode structure before thermal deformation.

FIG. 7a shows that the holder 63 fixes the electrode at the both sides of the electrode 62. Here, movable holders are installed at both sides, but on the other hand, the holders can be set capable of fixing a holder at a side and moving only the holder at the other side. The electrode shown in the drawing is under the condition before the plasma polymerizing processing and the electrode 62 is tightly fixed to both holders 63, thus to have the initial length F of the electrode same as the distance between holders.

Figure 7B:
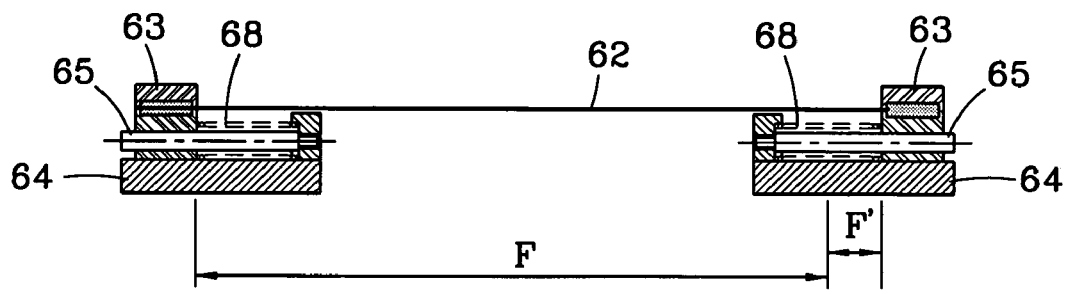
FIG. 7b is a cross-sectional view showing an electrode structure after thermal deformation.

FIG. 7b shows that the length of the electrode becomes slack as long as F' by heat deformation by performing plasma polymerizing processing for a long time. At this time, the electrode is also maintained tight without being slack. This is possible by the tensile force giving means of the electrode in accordance with the present invention. In the drawing, the compressive spring 68 pushes the holder in the longitudinal direction of the electrode 62 by an elastic force and the distance between the holders for fixing the electrode is lengthened as long as F'. Therefore, the electrode is not slack and maintains the tight condition even if the electrode is hung down by heat deformation.

The electrode structure is manufactured by fixing the plate using the combining means under the condition that the plate is abutted on the upper and lower surfaces of the end of the electrode and then fixing the plate using the combining means under the condition that the electrode holder is abutted to the upper and lower portion of the respective plate.

The electrode structure assembled as in the above is used under the condition that it is fixed to the inside of the processing chamber and in case of dismantling the electrode, the electrode is dismantled in the reverse order. With the present invention, installing and removing of the electrode can be eased more as shown in the embodiment described as follows.

Figure 8:
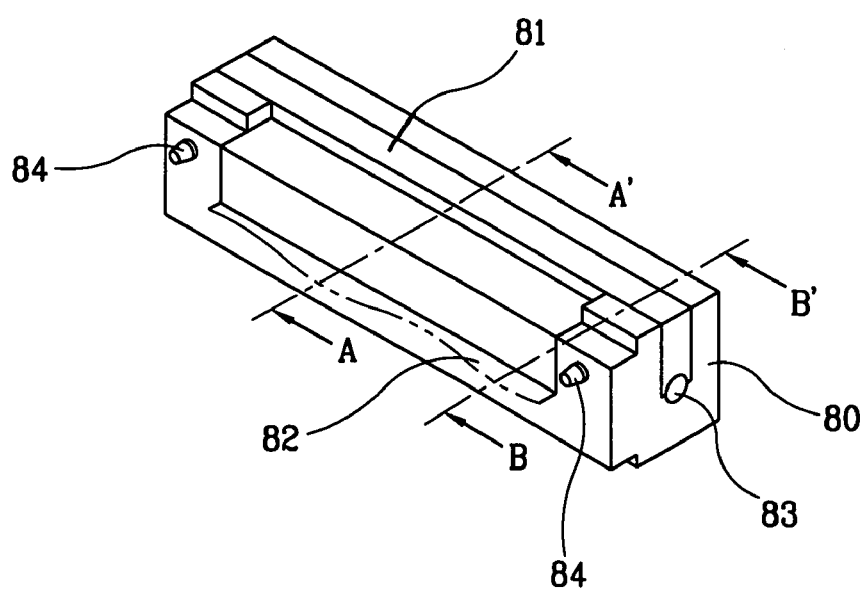
FIG. 8 is a perspective view showing still another embodiment of the present invention.

With reference to FIG. 8, the upper holder 81 is inserted-installed at the upper side of the lower electrode holder 80 having both ends fixed in the inner wall of the processing chamber and a cylindrical inner holder 83 to which an end portion of the electrode 82 is fixed is positioned between the lower holder 80 and the upper holder 81.

Figure 9:
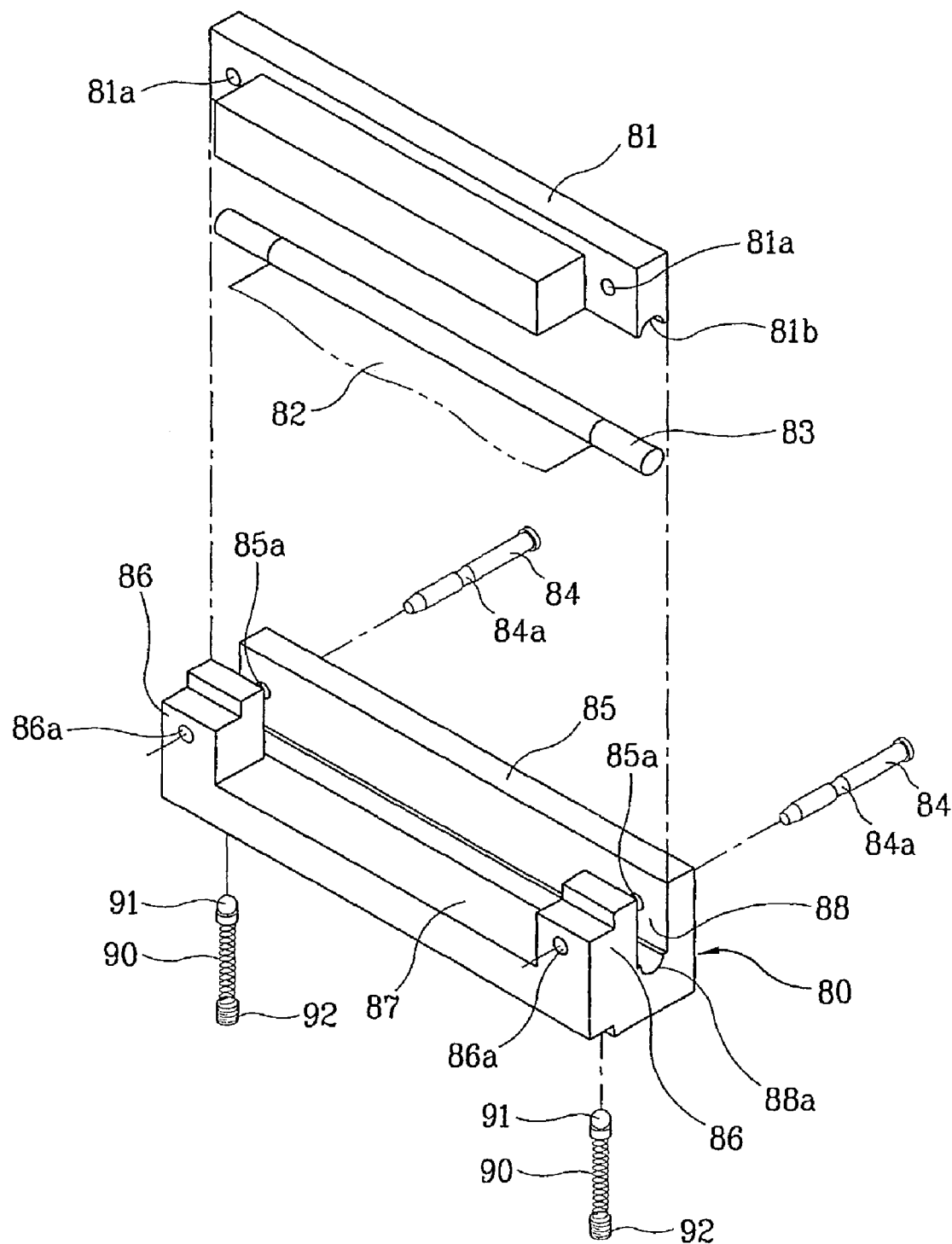
FIG. 9 is a perspective view showing the embodiment of FIG. 8 in detail.

With reference to FIG. 9, the electrode structure will be described in more detail as follows.

At the rear of the upper surface of the lower holder 80, a main wall part 85 is formed in the longitudinal direction to be protruded upwards and at the front both ends of the main wall 85, a protrusion part 86 is formed being protruded. At the insertion groove 88 formed between the protrusion part 86 and main wall part 85, the both ends of the cylindrical inner holder 83 and both end portions of the upper holder 81 are inserted in order.

Also, a lower mounting groove 88a is formed on the upper surface of the insertion groove in the longitudinal direction so that the lower surface of the inner holder 83 is mounted and an upper mounting groove 81b is formed on the lower surface of the upper holder 81 to which the upper surface of the inner holder 83 is abutted.

The electrode mounting part 87 is formed between the protrusion parts 86 so that the sheet-shaped electrode 82 fixed to the inner holder 83 so that an end portion is wound can be positioned.

In the present invention, to supply the power source into the electrode, the cylindrical inner holder can be lengthened to the outside of the upper holder and lower holder so that the inner holder can be connected with the lead line and as in the above embodiment, the lead line can be connected to the inner holder or electrode by forming a through groove in the upper holder.

On the other hand, at the both end portions of the main wall part 85 formed in the lower holder 80 and both end portions of the protrusion part 86 and the upper holder 81, pin holes 85a, 86a and 81a are respectively formed to be connected to each other in case of combining and a fixing pin 84 is positioned capable of being installed and removed in the pin holes formed as above, thus to prevent the upper holder from being seceded from the lower holder.

Figure 10:
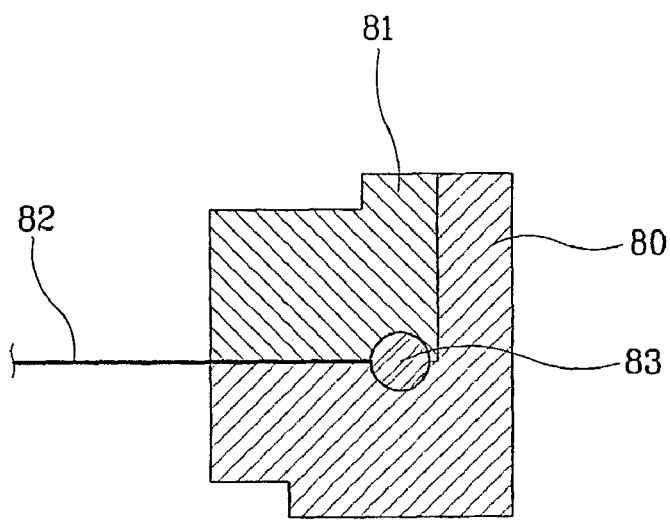
FIG. 10 is a cross-sectional view taken along section line A–A' of FIG. 8.
Figure 11:
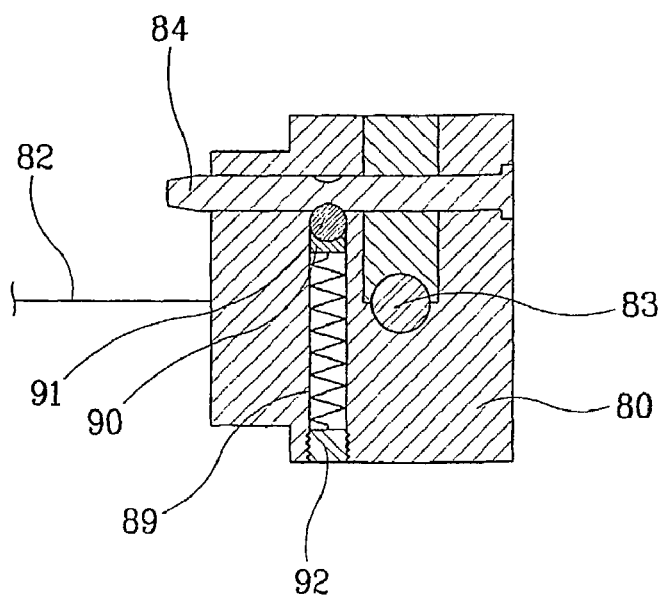
FIG. 11 is a cross-sectional view taken along section line B–B' of FIG. 8.

FIG. 10 is a cross-sectional view taken along section line A–A' of FIG. 8 and FIG. 11 is a cross-sectional view taken along section line B–B' of FIG. 8.

On the outer circumferential surface of the front portion of the fixing pin 84, a stopping groove 84a is formed in the semicircular shape with a predetermined depth. At the protrusion part 86 of the lower holder 80, a vertical holder (reference numeral 89 in FIG. 11) is formed in the vertical direction from the lower surface so that it is connected to the pin hole 86. On the vertical hole, a stopper ball supported by the spring 90 is inserted and secession of the fixing pin 84 is prevented by installing and removing the stopper ball 91 in a stopping groove 84a of the fixing pin 84. A negative screw part is formed on the inner circumferential surface of the inlet side of the lower portion of the vertical hole 89 and a screw cap 92 having a positive screw part formed on the outer circumferential surface to be combined with the screw is combined to the lower portion of the spring 90.

In case the above electrode structure is assembled, a cylindrical inner holder 83 is mounted in the lower mounting groove 88a formed on the upper surface of the lower holder 80 and the sheet-shaped electrode 82 connected to the inner holder 83 is installed in the electrode mounting part 87.

The both end portions of the upper holder 81 are combined being inserted in the insertion groove 88 of the lower holder 80. The upper surface of the inner holder 83 is abutted to the upper mounting groove 81b formed on the lower surface of the upper holder 81.

Under the above condition, the fixing pin 84 is inserted in the pin hole 85a at the rear of the main wall part 85 of the lower holder 80 and the fixing pin is combined thus to pass through the pin hole 81a of the upper holder and the pin hole 86a formed in the protrusion part 86 of the lower holder. When the stopping groove 84a formed in the fixing pin 84 passes the upper side of the vertical hole 89a, the stopper ball 91 supported upwards by the electricity of the spring 90 is inserted in the stopping groove 84a of the fixing pin 84.

In case the electrode structure in accordance with the present invention assembled as above is dismantled, the assembling process is performed in the reverse order.

Namely, when the user pulls the fixing pin 84 to the opposite direction that it is inserted, the stopper ball 91 inserted in the stopping groove 84a of the fixing pin moves downwards and is seceded from the stopping groove 84a and if the user pulls the fixing pin 84 continuously, the fixing pin 84 is completely seceded from the pin holes of the respective holders. Under the above condition, dismantling of the electrode can be performed easily by the process of separating the inner holder 83 connected with the upper holder 81 and the electrode from the lower holder 80 in order.

INDUSTRIAL APPLICABILITY

As so far described, according to the present invention, the interval with the polymerized substrate can be maintained uniformly by efficiently fixing the electrode in the chamber and replacement of the electrode can be eased. Also, dangers such as a electric shock can be prevented in advance by insulating parts except the part to which the power source is applied.

What is claimed is:

1. An apparatus for fixing an electrode in a plasma polymerizing apparatus, comprising:
   a processing chamber;
   a vacuum pump for maintaining vacuum condition in the chamber;
   at least one sheet-shaped electrode positioned in the chamber, for discharging high voltage;
   a power supply for applying electric power to the electrode;
   an electrode holder part made of insulating material, for covering and fixing the end of the electrode, said electrode holder part including an upper holder, a lower holder and a combining part for combining the two holders;

a lead line part passing the electrode holder part for electrically connecting the electrode and the power supply apparatus; and an internal holder made of a cylindrical conductive substance, which is fixed and covered by the electrode holder part and to which an end of the electrode is wound, wherein the lower holder further includes a fixing pin for fixing the upper holder and internal holder, and a secession preventing means for preventing the fixing pin from being separated.

2. The apparatus of claim 1, wherein the cylindrical internal holder is fixed being mounted in a mounting groove formed on the upper surface of the lower holder and the lower surface of the upper holder.

3. The apparatus of claim 1, wherein the lower holder has a main wall part to be protruded to the rear upper surface and a protrusion part at both front ends of the main wall part.

4. The apparatus of claim 1, wherein the fixing pin has a stopping groove at a predetermined depth on the circumferential surface of the front end.

5. The apparatus of claim 1, wherein respective pin holes are formed at the both ends of the main wall part formed in the lower holder and both ends of the protrusion and upper holder to be connected in case of being combined and the secession of the upper holder is prevented by inserting the fixing pin in the pin hole.

6. The apparatus of claim 1, wherein a vertical hole formed in the vertical direction on the lower surface and connected with the pin hole is formed at the protrusion of the lower holder.

7. The apparatus of claim 6, wherein a secession preventing means of a fixing pin, comprising a stopper ball supported at one end of the spring and a screw cap connected at one the other end of the spring, is inserted in the vertical hole.

8. The apparatus of claim 1, further comprising an elastic part for providing an elastic force in the longitudinal direction of the electrode.

9. The apparatus of claim 8, wherein the elastic part includes:

a supporting part for supporting the electrode holder part at the lower portion of the electrode part having a protrusion at the front;

a sliding guide pin lengthened to the protrusion penetrating the electrode holder part; and an elastic body positioned between the protrusion and the holder.

10. The apparatus of claim 9, wherein the electrode holder part moves in the longitudinal direction of the electrode along the sliding guide pin.

* * * * *

UNITED STATES PATENT AND TRADEMARK OFFICE
CERTIFICATE OF CORRECTION

| | | |
|---|---|---|
| PATENT NO. | : 7,004,108 B2 | Page 1 of 1 |
| APPLICATION NO. | : 10/181228 | |
| DATED | : February 28, 2006 | |
| INVENTOR(S) | : Dong-Sik Youn et al. | |

It is certified that error appears in the above-identified patent and that said Letters Patent is hereby corrected as shown below:

Title Page, Item (30) Foreign Application Priority Data

Please correct the publication number to read:

-- 2000-68029 --

Signed and Sealed this

Eighth Day of April, 2008

JON W. DUDAS
*Director of the United States Patent and Trademark Office*